United States Patent
Ries

[11] Patent Number: 5,394,416
[45] Date of Patent: Feb. 28, 1995

[54] LASER MODULATION CONTROLLER USING ADDITIVE AND AMPLITUDE MODULATION CONTROL TONES

[75] Inventor: Gordon W. Ries, Plano, Tex.

[73] Assignee: Alcatel Network Systems, Inc., Richardson, Tex.

[21] Appl. No.: 241,178

[22] Filed: May 11, 1994

[51] Int. Cl.$^6$ ............................................. H01S 3/10
[52] U.S. Cl. ........................................ 372/26; 372/38; 372/31; 372/32; 372/29
[58] Field of Search ...................... 372/26, 31, 32, 38, 372/29

[56] References Cited
U.S. PATENT DOCUMENTS

| | | | |
|---|---|---|---|
| 4,243,951 | 1/1981 | Wolkstein et al. | 372/26 |
| 4,796,266 | 1/1989 | Banwell et al. | 372/26 |
| 4,924,470 | 5/1990 | Ries | 372/32 |

Primary Examiner—Léon Scott, Jr.
Attorney, Agent, or Firm—Baker & Botts

[57] ABSTRACT

A laser modulation controller (10) provides laser modulation control by DC bias (54) to a laser (22) with a first control tone (32), amplitude modulating (70) a non-return to zero (NRZ) input working signal (18) to be converted to light output with a second control tone (30), detecting the first control tone from a portion of the light output of the laser (88, 26) as a third signal (58) which is proportional to laser gain, detecting the second control tone (30) from a portion of the light output of the laser as a fourth signal (60) which occurs only if the laser is being modulated in or below the lasing threshold region, and substantively combining the third (58) and fourth (60) signals to generate a fifth signal (84) for use as a control of the amplitude of the NRZ working signal (18).

11 Claims, 3 Drawing Sheets

LASER MODULATION CONTROLLER USING ADDITIVE AND AMPLITUDE MODULATION CONTROL TONES

TECHNICAL FIELD OF THE INVENTION

The present invention relates in general to telecommunication devices and, in particular, to high-speed optical communication systems. Even more particularly, the present invention relates to an improved laser modulation device for precisely controlling the modulation of laser signals in a high-speed optical communication system that uses additive and amplitude modulation control tones to prevent bit-error degradation due to laser chirp.

BACKGROUND OF THE INVENTION

When a data pulse is applied to a laser diode such as in an optical communication system, the laser diode switches between an OFF condition, where very little current flows through the diode and there is no substantial lightwave or optical output signal, and an ON condition, where a large amount of current flows through the laser diode to cause it to lase and produce an optical output signal. As the laser changes between the OFF condition and the ON condition, a shift occurs in wavelength. This shift is commonly called "chirp." This wavelength shift or chirp causes the optical pulse to disperse or smear in time as the pulse travels through the optical fiber. This phenomenon makes it difficult to distinguish between a logic 0 level and a logic 1 level in the signal at the optical receiver. This difficulty may be termed "bit-error rate degradation."

In high data rate optical communication systems, laser chirp characteristics impose a significant limitation on the maximum obtainable transmission distance. In order to minimize laser chirp, the amplitude of the non-return-to-zero (NRZ) data modulation applied to the laser must be controlled to avoid driving the NRZ data logic zero level into the laser threshold region. This restriction prevents the use of known laser threshold sensing modulation control techniques that are used at lower data rates.

Existing approaches for preventing bit-error rate degradation due to laser chirp in high-speed optical communication systems include (1) techniques that use laser threshold sensing; (2) techniques that add a low-frequency control tone to the NRZ data logic 1; and (3) approaches that monitor and measure the laser gain at the laser diode back facet. These solutions have significant limitations as the following discussions explain.

Threshold sensing techniques are unsatisfactory because they require the laser diode to operate in the threshold region. Laser operation in the threshold region, however, inherently produces excessive chirp. This approach, therefore, is an unsatisfactory way to prevent bit-error rate degradation.

Adding a low-frequency tone to the logic 1 of the NRZ data stream in high speed systems does not work well, because it is difficult to add a low-frequency tone to only one side of the NRZ data stream. This technique is also expensive, at least in part because it requires the use of radiofrequency devices for logic 1 signal level manipulations. Reliability is also less than desirable in techniques that add a low-frequency tone to the logic 1, because the radiofrequency devices that can accomplish this detection are fragile. These techniques also generally require a good phase match between the primary high speed data path and the secondary logic/manipulation path over the communication system temperature and voltage operating ranges. This phase match requirement even further adds to the difficulty of accomplishing this technique.

Existing techniques that measure the laser gain by monitoring the high speed data with a back facet monitor do not work well for numerous reasons. One reason is that back facet detectors generally have limited bandwidth. Also, the amount of high speed signal data at the laser back facet that is available for detection is small. Back facet control systems that monitor these high speed signals, therefore, must recover a small signal and attempt to monitor signals that may have frequencies of up to 1.2 GHz. These techniques require a significant amount of broadband gain to recover the NRZ data from the laser diode back facet signal. In addition, these techniques require coupling high speed electronic circuits with the laser diode back facet. High speed electronic circuits that can couple with the laser back facet, furthermore, are generally expensive and unreliable. Due to the broadband nature of this technique, inherent detector limitations, and the type of signal that this approach detects, existing back facet control systems do not produce a sufficiently high signal-to-noise ratio to ensure stable modulation level control.

Gain stability over normal operating temperature and voltage ranges is yet another difficulty that existing back facet control systems employing these techniques experience. That is, as temperature or voltage changes, drift in the NRZ signal level occurs due to gain changes in the associated broadband amplifiers. This gain instability adversely affects detector accuracies. As the drift increases, so do detector inaccuracies. These inaccuracies also make monitoring high speed data to measure laser gain an unacceptable technique.

Consequently, there is a need for method and circuit that control the modulation of a laser that provides communication signals while the laser operates in its linear region.

There is a need for a laser modulation controller that does not require a significant bandwidth signal from the laser back facet.

There is a further need for a laser modulation controller that does not require expensive radiofrequency or other high speed electronic detection circuits or circuits that are highly sensitive to optical communication system temperature or voltage changes.

SUMMARY OF THE INVENTION

The present invention, therefore, provides a laser modulation controller and method of operating the modulation controller that overcomes or substantially reduces limitations associated with existing modulation controllers for laser communication signals by using additive and amplitude modulation control tones to prevent bit-error degradation due to laser chirp.

According to one aspect of the invention, there is provided a laser modulation control that adds the first control tone to circuitry for DC biasing a laser. The modulation controller amplitude modulates an input non-return-to-zero (NRZ) working signal that the laser converts to a light output using a second control tone. The method further includes the step of detecting the first control tone from a portion of the light output of the laser as a third signal which is proportional to laser gain. The process that the circuit performs further involves detecting the second control tone from a portion of the light output of the laser as a fourth signal that occurs only if the laser is being modulated in or below the lasing threshold region. Finally, the controller substantively combines the second and fourth signals to generate a fifth signal that controls the amplitude of the NRZ working signal.

According to another aspect of the present invention, the modulation controller AC-couples NRZ data into the laser. The AC coupling provides at least two advantages. One advantage is that the average power control loop and the modulation control loop are independent. Another advantage is that the DC biasing of the laser driver is not restricted by the bias requirements of the laser. The present invention also uses primarily low frequency signal processing elements. As a result, practicing the invention is both economically practical and very repeatable.

Another aspect of the present invention is its tone recovery function. Tone recovery uses synchronous detection which allows use of low bandwidth (i.e., <1 Hz) control loops. This, in turn, allows keeping the tone levels low, typically less than 1.5% of the NRZ data modulation peak level while still maintaining an acceptable signal-to-noise ratio. Low control tone levels are important, because the control tones can add jitter to the clock signal in the optical receiver recovers. This gives present invention an advantage over implementations which use peak detection, which is sensitive to broadband noise, when recovering the NRZ data at the output of the back facet monitor diode.

The present invention, thus, overcomes the problem of laser chirp using low speed carrier signal parts. The various embodiments are also easy to implement relative to the techniques that add a control tone to the NRZ data logic 1 signal. At least one reason for this is that no critical signal matching is necessary. There is only the need in the present invention for one high speed path. Additionally, the present invention requires no phase tracking. There is also no need for a radiofrequency device and the complications relating to using such a device.

The present invention possesses certain technical advantages over techniques that monitor high speed signals. For example, the signal monitoring device for implementing the present invention does not have to be a high speed device. This allows for a large signal-to-noise ratio in a circuit that possesses the inherent simplicity of monitoring synchronous data. Consequently, the present invention is more economical to implement and is not gain limited. The circuit of the present invention also can monitor the entire bandwidth of the control tone signal from the laser in contrast to the limited bandwidth high speed devices.

These and other technical advantages will become more apparent upon a review of the following drawings and accompanying detailed descriptions.

BRIEF DESCRIPTION OF THE DRAWINGS

The invention and its modes of use and advantages are best understood by referring to the following description of illustrative embodiments when read in conjunction with the accompanying drawings, wherein.

DETAILED DESCRIPTION OF THE INVENTION

The illustrative embodiments of the present invention are best understood by referring to the FIGURES, wherein like numerals are used for like and corresponding parts of the various components.

Figure 1:
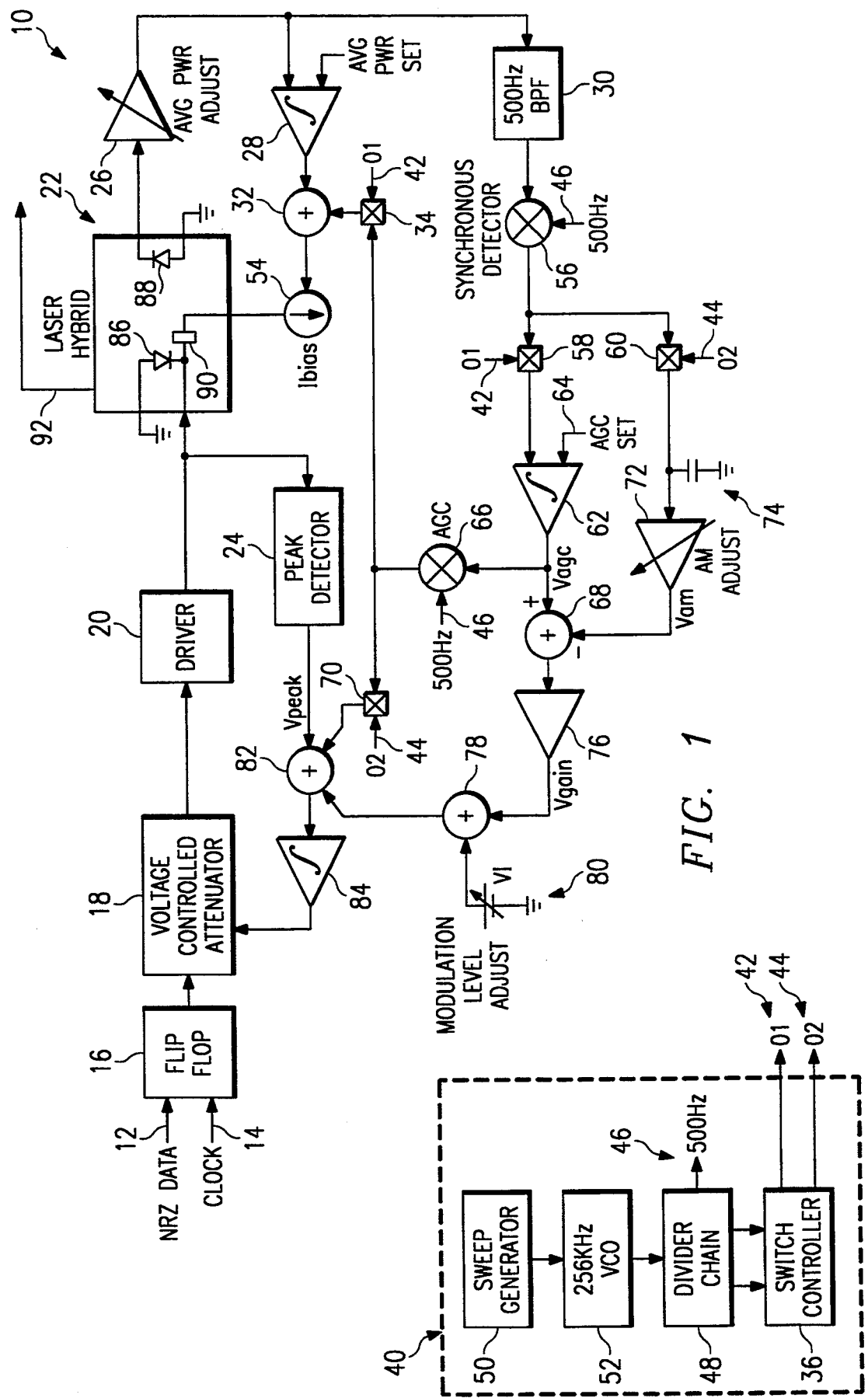
FIG. 1 provides a block diagram of one embodiment of the preset invention.

In FIG. 1, subassembly block diagram of modulation controller circuit 10 shows NRZ data input 12 and clock input 14 feeding into flip flop circuit 16. Flip flop circuit 16 provides a retimed NRZ data output to voltage controlled attenuator (VCA) 18 which provides an amplitude controlled NRZ signal to driver 20. Driver 20 has outputs to laser hybrid circuit 22 and peak detector 24. From laser hybrid circuit 22 output goes to average power adjust amplifier 26. Average power adjust amplifier 26 feeds to average power set amplifier 28 and 500 Hz band pass filter (BPF) 30. Output from average power set amplifier 28 goes to summer circuit 32 as does output from switch node 34. Switch node 34 receives an 01 signal from switch controller 36 of signal generation circuit 40.

Signal generation 40 which provides signal inputs to circuit 10 produces an 01 signal on lead 42 and an 02 signal on lead 44 from switch controller 36, as well as a 500 Hz signal on lead 46 from divider chain 48. Thus, within signal generation circuit 40, sweep generator 50 provides input to 256 KHz voltage control oscillator (VCO) 52 that outputs to divider chain 48. Divider chain 48 sends a divided signal to switch controller 36. From switch controller 36 come 01 signal 42 and 02 signal 44. The modulation controller circuit 10 of FIG. 1, therefore, receives a 500 Hz signal on lead 46, an 01 signal on lead 42, and an 02 signal on lead 44 to provide the necessary degree of modulation control for the laser hybrid circuit 22 output.

Returning to modulation control circuit 10, as mentioned, output from switch node 34 adds in summer circuit 32 to output from average power set amplifier 28. This produces a summed signal to control $I_{bias}$ current bias circuit 54. Current bias circuit 54, in part, controls operation of laser hybrid circuit 22. From 500 Hz BPF 30, synchronous detector 56 receives a signal that it multiplies with the 500 Hz signal from leads 46 to provide inputs to switch nodes 58 and 60. Switch node 58 combines an 01 signal at lead 42 with output from synchronous detector 56 and feeds this signal to integrating operational amplifier 62. Integrating operational amplifier 62 also receives an AGC set signal from lead 64 to integrate with the input from switchnode 58 and send the resulting signal to AGC multiplier circuit 66 and summer circuit 68. AGC multiplier circuit 66 also receives a 500 Hz signal from lead 46 and directs its output to switch node 70 and switch node 34. Switch node 60 receives an 02 signal from lead 44 and combines this with the synchronous data from 56 output to produce a signal input to amplitude modulation (AM) adjustment amplifier 72. Note that this signal to AM adjustment amplifier 72 is capacitively coupled to ground via capacitor 74. From AM adjustment amplifier 72, a voltage signal goes to summer circuit 68.

Summer circuit 68 adds the output from integrating operational amplifier 62 and AM adjustment amplifier 74 to produce an input for voltage gain amplifier 76. Voltage gain amplifier 76 provides an input to summer circuit 78 as does modulation adjust voltage supply 80. Summer circuit 82 receives peak voltage output from peak detector 24, output from switch node 70, and output from summer circuit 78. Summer circuit 82 then sends this summed value to integrating operational amplifier 84 for controlling VCA 18.

In laser hybrid circuit 22, there are two diodes 86 and 88, (the rear beam detector) and isolation device 90. Isolation device 90 operates as an inductor that lets DC signals pass through but not radiofrequency signals. In its operation, laser hybrid circuit 22 produces two outputs. One output, the NRZ modulated optical signal, goes to optical fiber 92. The second output from the laser back facet of laser hybrid circuit 22 goes to average power adjust amplifier 22.

Figure 2:
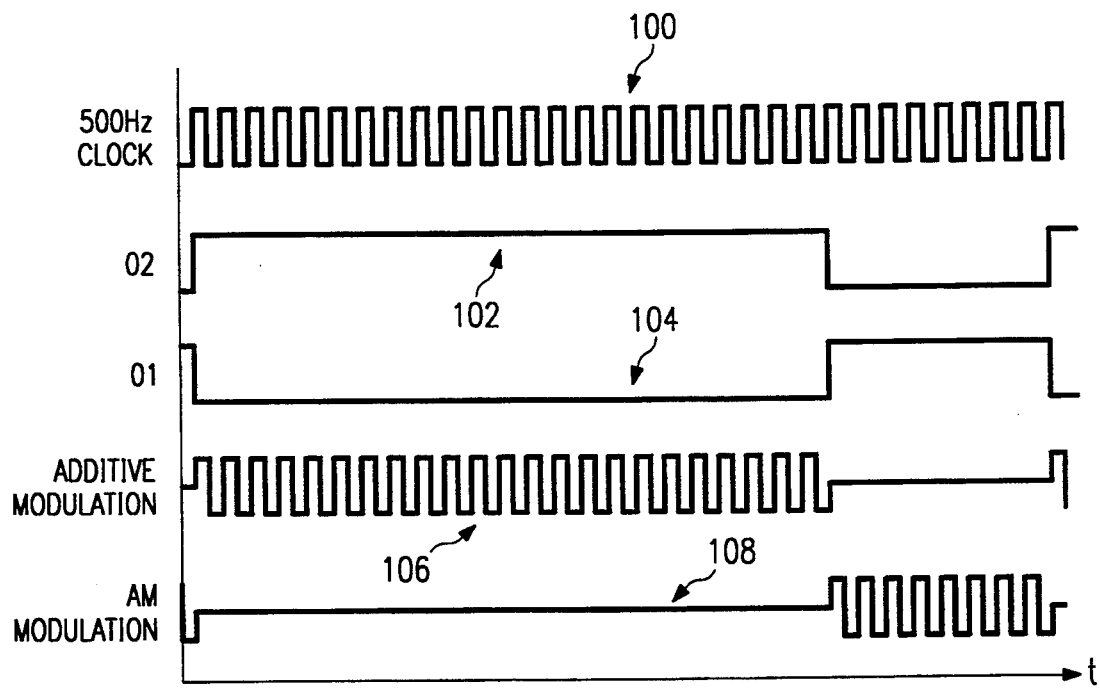
FIG. 2 illustrates timing diagrams applicable to the operation of the present invention.

FIG. 2 shows timing diagrams associated with the signals from signal generation circuitry 40 and modulation controller circuit 10. In particular, FIG. 2 shows 500 Hz clock signal that divider chain 48 produces from the 256 KHz signal of VCO 52, as well as 02 signal 102 and 01 signal 104 that come from switch controller 36. Additive modulation signal 106 occurs within modulation controller circuit 10 when imposing 500 Hz clock signal 100 on 01 signal 102 as is done at switch node 34. AM signal 108 occurs when imposing 500 Hz clock signal 100 on 01 signal 104 as is done at switch node 34.

Figure 3A:
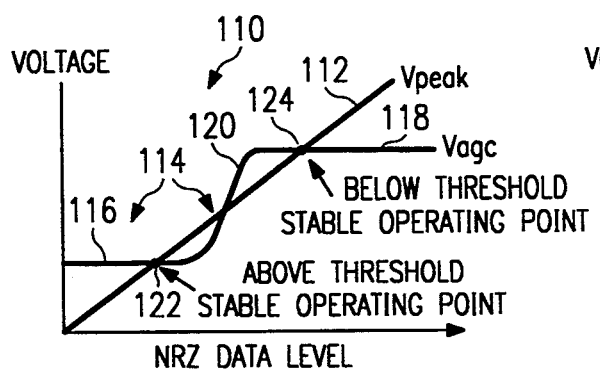
FIGS. 3a through 3d demonstrate combining additive and amplitude modulation signals to produce a single stable operating point for the system of the present embodiment.

FIGS. 3a–3d illustrate $V_{peak}$ and $V_{agc}$ voltage levels associated with the peak and AGC signals that occur within laser modulation control circuit 10 according to the NRZ data level. In particular, FIG. 3a illustrates that a two stable operating point system exists when modulation controller circuit 10 employs only additive modulation. That is, plot 110 shows that as the NRZ data level increases, $V_{peak}$ line 112 increases. Also, $V_{agc}$ signal 114 increases from a first stable level 116 to a second stable level 118. Between levels 116 and 118 is transition ramp 120. The points at which $V_{agc}$ equals $V_{peak}$ represent two stable operating points for laser modulation controller circuit 10. Thus, at point 122 stable operation of laser hybrid circuit 22 occurs at an above-threshold stable operating point. At point 124 below-threshold stable operation occurs.

Figure 3B:
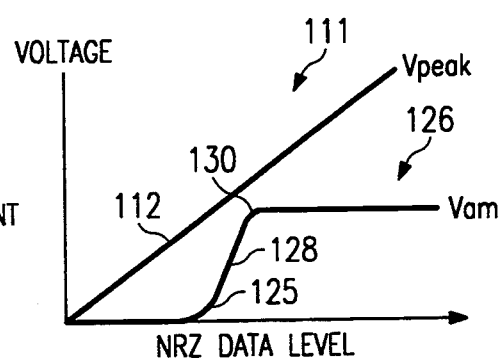

FIG. 3b illustrates in plot 111 amplitude modulation voltage, $V_{am}$, relative to $V_{peak}$ voltage levels. As can be seen, until the NRZ data level reaches point 125 $V_{am}$ signal 126 is not detectable. After point 125, $V_{am}$ signal 126 increases along ramp 128 until point 130, at which point $V_{am}$ goes to a maximum level 132 where it stays irrespective of the NRZ data level.

Figure 3C:
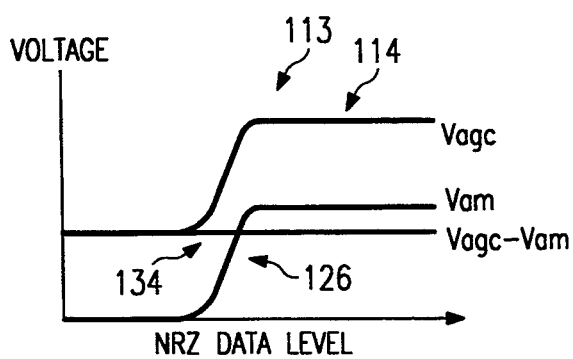

FIG. 3c illustrates in plot 113 the effect of subtractive compensation using $V_{am}$ signal 126 and $V_{agc}$ signal 114 to produce a steady voltage level ($V_{agc}-V_{am}$) signal 134. ($V_{agc}-V_{am}$) level 134 represents the result of subtracting from the $V_{agc}$ voltage level 114 the $V_{am}$ voltage level 126. As can be seen, ($V_{agc}-V_{am}$) voltage level 134 is a horizontal line, which may be taken to mean that irrespective of the NRZ data level, the voltage from summer circuit 68 remains constant.

Figure 3D:
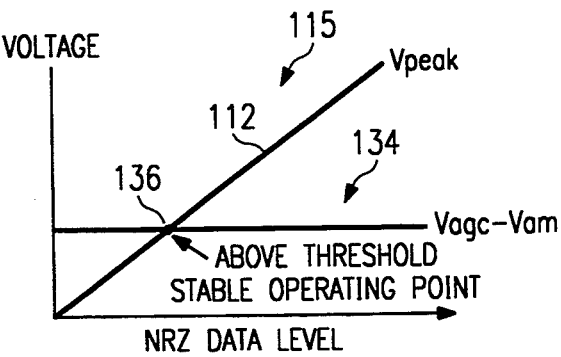

Referring now to FIG. 3d, by imposing ($V_{agc}-V_{am}$) voltage level 134 on $V_{peak}$ line 112, plot 115 results to demonstrate a single stable operating point system that uses additive and amplitude modulation. Thus, intersection 136 represents a stable above-threshold operating point for operation of laser hybrid circuit 22 irrespective of the NRZ data level.

OPERATION

The following discussion outlines in more detail the operation of laser modulation controller 10 of FIGS. 1 through 3d to describe more completely the present embodiment of the invention. One embodiment of the laser modulation controller 10 may be employed in a circuit that Alcatel Network Systems, Inc. of Richardson, Tex. manufactures and that has name, 1648SM OTX Subassembly. Understanding the operation of the 1648SM OTX subassembly assists to make clear several inventive concepts of the present embodiment. One aspect of the present embodiment, therefore, is its ability to maintain a constant electrical modulation level to laser hybrid circuit 22 output signal over time. As the electrical performance characteristics of laser hybrid circuit 22 change over time, modulation controller circuit 10 adapts to these changes to keep constant the laser hybrid circuit 22 electrical input. Another aspect of modulation controller circuit 10 is its ability to maintain a constant average power level. Yet a third aspect of the present embodiment is its ability to look at the slope of the laser hybrid circuit 22 output and use that signal for laser modulation control. The present embodiment measures the slope of the laser line in real time and uses that information to correct the amount of modulation that laser modulation controller 10 applies to laser hybrid circuit 22. This keeps the output optical waveform constant over both time and temperature changes.

Electrical modulation level control directly affects operation of driver 20 and peak detector 24. Keeping the electrical modulation level constant assures that in the event of a change in the electrical output to or the operation of driver 20 due to temperature or some other parameter, for example, operation of laser hybrid circuit 22 remains stable and constant. Peak detector 24 responds to the driver 20 output voltage. Modulation level adjustments can occur by responding to the output of peak detector 24, i.e., $V_{peak}$ and controlling VCA input to driver 20 according to $V_{peak}$ levels.

To achieve this result, summer circuit 82 sums in $V_{peak}$ with signals from summer circuit 78 and switch node 70. The result is a DC level that determines how much input peak detector 24 should receive. That is, controlling the driver 20 output amplitude controls the electrical modulation within laser modulation controller circuit 10. Peak detector 24 produces a DC level signal that is proportional to the driver 20 output. This DC level is compared within amplifier 84 to a DC modulation level to determine how much modulation VCA 18 should produce to cause driver 20 to drive laser hybrid circuit 22. The DC level for comparison comes from summer circuit 82. Thus, driver 20 input is corrected according to this comparison. This loop controls the amount of electrical modulation going into laser hybrid circuit 22. Integrating operational amplifier 84, therefore, controls the response of VCA 18 to produce the necessary input to driver 20.

U.S. Pat. No. 4,924,470 entitled "Laser Diode Control Apparatus" by Gordon W. Ries, the inventor hereof, and U.S. Pat. No. 5,017,880 entitled "Varying Operational Frequency Control Circuit Apparatus with Noise Minimizing Feature" by John H. Dugan and Gordon W. Ries, both of which patents are assigned to Alcatel Network Systems, Inc. of Richardson, Tex., describe laser modulation control circuits that may effectively employ the electrical modulation circuitry and process of the present embodiment. Consequently, they are hereby expressly incorporated by reference for this and all other purposes consistent with the inventive concepts herein described.

Laser hybrid circuit 22 provides an average laser power input to average power adjust amplifier 26. Average power adjust amplifier 26, in response, generates two outputs. One output controls $I_{bias}$ current source 54. The other output controls modulation of the laser output signal. Control of the $I_{bias}$ current source 54 occurs through monitoring the DC level signal from the laser hybrid circuit back facet that is proportional to the average optical power level. The other component from average power adjust amplifier 26 is a low frequency 500 Hz tone that has an amplitude proportional to the slope of the laser line from laser hybrid circuit 22. Average power adjust amplifier has an adjustable gain that is set to establish a desired average optical power coming out of laser hybrid circuit 22. Setting the gain of average power adjust amplifier 26 generally occurs only once during the manufacture of the circuitry to accommodate for differences and may exist among each individually manufactured circuit.

Photodetector diode 88 of laser hybrid circuit 22 serves as the laser back facet monitor or rear beam detector which sends an average power control signal that goes into the average power adjust amplifier 26. This input controls the average power of the laser. The second output from average power adjust amplifier 26 goes to 500 Hz BPF 30. The 500 Hz BPF 30 strips off the DC component plus any noise that the photodetector produces and data components from the NRZ signal to produce a clean 500 Hz tone signal. A 500 Hz square wave goes from lead 46 into synchronous detector 56. Synchronous detector 56, in response, produces a DC voltage that is proportional to the 500 Hz tone level which itself is proportional to the gain of laser hybrid circuit 22. The DC voltage goes into 01 switch node 58 and 02 switch node 60. The 01 switch node 52 receives the 01 signal from lead 42 to control additive modulation. The 02 switch node 60 receives the 02 signal from lead 44 for amplitude modulation.

In the additive modulation mode operations 01 switch nodes 58 and 34 close. Once 01 switch node 34 closes a 500 Hz tone is put out to the $I_{bias}$ current from current source 54. This 500 Hz is superimposed on the optical signal from laser hybrid circuit 22. The current going into laser hybrid circuit 22, therefore, has the following three components: (1) a DC component to control the average laser bias from current source 54; (2) a current from driver 20 for high frequency modulation, and (3) a 500 Hz modulation square wave component that exists when 01 switch node 34 is closed. When laser hybrid circuit 22 lases or produces light, a 500 Hz tone travels along optical fiber 92 on the logic 0 and logic 1 levels of the NRZ modulated optical signal light. $I_{bias}$ current source 54 pulls the current through laser diode 85. This sets up the average light power that laser hybrid circuit 22 produces. Driver 20 then adds on top of that a high frequency NRZ modulation signal. When 01 switch node 34 closes, the 500 Hz signal also adds into the laser. The light from laser hybrid circuit 22, therefore, is a function of the current that goes through the laser.

If the 01 switch nodes 34 and 58 are not closed, then 02 switch nodes 60 and 70 are closed, because the 01 and 02 switch control signals are 180° out of phase with one another. $V_{agc}$ amplifier 62 compares the recovered 500 Hz tone level to an AGC set point on lead 64. This produces an error voltage called $V_{agc}$. If the 500 Hz tone amplitude is too small, then $V_{agc}$ increases. Conversely, if the 500 Hz tone amplitude is too large, $V_{agc}$ drops.

Amplifier 62 not only produces an error voltage, $V_{agc}$, but also holds the $V_{agc}$ level and as such serves as a sample and hold when 01 switch node 58 opens. Amplifier 62 holds the last voltage to provide error signal for use in the circuit during the interval when 01 is open. Every time 01 switch node 58 closes, therefore, this part of the circuit updates itself. Amplifier 62 provides two parallel outputs. One output is the $V_{agc}$ output to multiplier circuit 66. The other amplifier 64 output goes to summer circuit 68.

The 500 Hz square wave amplitude from multiplier 66 is proportional to $V_{agc}$. So, if $V_{agc}$ is one volt, the square wave coming from multiplier 66 is one volt peak, i.e., two volts peak-to-peak. Controlling this level keeps the 500 Hz tone from synchronous detector 56 constant as the gain from laser hybrid circuit 22 changes in response to temperature or other changes by varying the amount of the 500 Hz tone that goes into laser hybrid circuit 22. Note also that $V_{agc}$ is inversely proportional to laser gain. Therefore, if laser gain drops, $V_{agc}$ increases in the circuit.

The output from AGC multiplier 66, a 500 Hz square wave, simultaneously goes to the 02 switch node 70 and 01 switch node 34. If 01 switch node 34 is closed, then the AGC multiplier 66 output goes into summer node 32. Conversely, if 01 switch node 34 is opened, then 02 switch node 70 is closed and AGC multiplier 66 output goes to summer node 82 to be part of the control input to VCA 18 and, thereby, amplitude modulate the NRZ data applied to driver 20 and peak detector 24. In other words, 01 switch node being closed produces additive modulation for laser hybrid circuit 22 output. 02 switch node 70 being closed, on the other hand, produces AM modulation on the laser hybrid circuit 22 outputs by modulating the VCA 18 gain.

When 02 switch node 70 closes, the NRZ data is amplitude modulated with a 500 Hz tone. This tone appears at the output of the peak detector as $V_{peak}$. The integrating amplifier 84 acts to keep the 500 Hz tone from the peak detector equal to the 500 Hz tone from 02 switch node 70 and thus to control the level of the amplitude modulation on the NRZ data.

When 02 switch node 70 is closed, a D.C. voltage proportional to the recovered 500 Hz AM tone appears at the output of the synchronous detector 56. The output of the synchronous detector 56 is routed to a storage capacitor 74 through 02 switch node 60. Capacitor 74 acts as a hold device when 02 switch node 60 is open and, thus, maintains $V_{am}$ constant when 02 switch node 60 is open.

The gain of amplifier 72 is adjusted so that $V_{am}$ exactly compensates $V_{agc}$ to produce a constant output from summer node 68 over all NRZ data levels. The summer node 68 output goes to $V_{gain}$ amplifier 76. This output further controls the amount of modulation into laser hybrid circuit 22. The amount of modulation inversely relates to the laser hybrid circuit 22 gain. So, if the laser hybrid circuit 22 gain drops off, there is the need to increase the amount of RF modulation from driver 20. The $V_{agc}$ signal is a DC voltage that is inversely proportional to laser hybrid circuit 22 gain. In the present embodiment, however, there is the need to amplify $V_{agc}$ by a small amount to make the right amount of change in the laser hybrid circuit 22 output. Thus, for example, to make the laser hybrid circuit 22 output change by a factor of two, $V_{gain}$ may only need to change by a factor of 1.5. Amplifier 76, therefore, provides a scaling amplifier that sets the gain so that the RF modulation responds correctly to a change in gain from laser hybrid circuit 22. Also, summer node 78 receives input $V_1$ as an offset. This portion of the circuit, therefore, provides a gain control to control the laser line slope and a modulation level adjustment, $V_1$, to provide an offset from which the laser line operates to permit precise control of laser hybrid circuit 22. The modulation level adjustment voltage, $V_1$, therefore establishes an offset that serves as a baseline on top of which $V_{gain}$ operates.

In summary, VCA 18 serves for two purposes in the present embodiment. One purpose is to control the level of the high frequency data electrical input into laser hybrid circuit 22. The second purpose is to actually amplitude modulate, when 02 is closed, the high frequency data that goes into laser hybrid circuit 22. In other words, the VCA 18 loop controls how much electrical modulation signal comes out of driver 20. It also amplitude modulates, with the 500 Hz tone, the high frequency NRZ data that is applied to laser hybrid circuit 22.

In operation, subassembly block diagram 40 of FIG. 1, which includes sweep generator 50, frequency modulates the 256 KHz signal that voltage controlled oscillator (VCO) 52 generates. Divider chain 48 divides the 256 KHz signal down to produce a 500 Hz signal. Divider chain 48 then further divides down the 500 Hz signal further to produce 01 and 02 signals. FIG. 2, therefore, relates timing diagrams for these signals. In FIG. 2 appears a 500 Hz clock signal 100 along with the longer duration 02 signal 102 and 01 signal 104. FIG. 2 shows that 02 signal 102 and 01 signal 104 are synchronous to 500 Hz clock signal 100. As a result, when time multiplexing these tones, there is a whole number ratio between the number of cycles of additive modulation that 02 signal 102 produces as additive modulation signal line 106 depicts and the number of cycles of amplitude modulation that 01 signal 104 produces and as AM signal line 108 portrays.

Chopping off half a cycle or producing other than the whole number ratios has the adverse effect of introducing a DC offset. The average value of additive modulation signal 106 is zero for the preferred embodiment. The ratio of additive modulation cycles to AM cycles, for example, may be a 3:1 ratio (i.e., 24:8 during 32 cycles), or 1:3 (i.e., 8:24 during 32 cycles) or even a 1:1 ratio (i.e., 16:16 per 32 cycles). The present embodiment uses more additive modulation cycles (i.e., 24 of 32 cycles) than AM cycles (i.e., 8 of 32 cycles) because additive modulation is more important than the amplitude modulation for laser control. This is because generally only under failure conditions is amplitude modulation needed. Performing more additive modulation makes circuit operation more stable, because it minimizes drift in the laser operation over time.

FIGS. 3a through 3d, as previously mentioned, relate $V_{agc}$ to $V_{am}$, the AM voltage, to produce a stable operating point in the laser hybrid circuit 22 operation. FIG. 3a describes part of the operation of the present embodiment. The $V_{agc}$ line 114 moves from above threshold operating region on the left to below the threshold operating region on the right to intersect $V_{peak}$ line 112. At intersection point 124, the logic 0 of the NRZ modulation is below the laser threshold. As the modulation increases, movement proceeds to the right, at some point $V_{agc}$ crosses $V_{peak}$. $V_{peak}$ represents the amount of modulation being applied to the laser, which increases linearly with increasing modulation. The 500 Hz tone is carried on both the logic 1 and the logic 0 and essentially takes two paths through laser hybrid circuit 22. The paths have different gains depending on where the logic 1 and the logic 0 levels are with respect to the threshold region of the laser. With no modulation, both the logic 1 and the logic 0 path have the same gain. This is the left hand portion 116 of $V_{agc}$ line 114. And as the NRZ modulation increases, they maintain the same gain. Both levels are fairly high on the linear slope of the laser hybrid circuit 22 laser response curve which is commonly known as the laser L-I (light vs. current) curve. The linear region of the laser line that the present embodiment uses has a fairly steep slope. On moving into the threshold region where the laser L-I curve starts to bend up, the gain seen by the 500 Hz tone carried on the logic 0 starts to drop. $V_{agc}$, however, increases in response to this loss of gain. This is because the AGC device wants to keep a constant 500 Hz tone coming out of the back facet detector for the average power amplifier 26.

As $V_{agc}$ increases, the circuit applies more 500 Hz modulation through the $I_{bias}$ current source 54. As a result, the amount of 500 Hz signal coming out of the average power amplifier 26 remains constant. As NRZ modulation level continues to increase, the logic 0 level drives through the threshold region, it requires more and more 500 Hz modulation of the optical output signal. This is because the gain on the logic 0 level keeps dropping off. Modulation controller circuit 10 of the present embodiment corrects for the loss of logic 0 level signal by applying more 500 Hz modulation. Once below the threshold region, there is basically no gain on the logic 0 signal. The entire 500 Hz signal is then carried through the laser at the logic 1 level. As a result, it is necessary to inject about twice as much 500 Hz signal to generate the same amount of 500 Hz modulation at the input of the average power amplifier 26. In many devices, this produces a second stable operating point such as point 124 of FIG. 3a. For example, on some devices, $V_{peak}$ crosses $V_{agc}$ in three places.

One of these points is unstable, the other two are stable intersection and operating points. At the unstable points, the laser line moves one way or the other to approach one of the stable operating points. Thus, the laser operation on the points which are stable and on lower part of the $V_{peak}$ line 112 is where laser gain exists on both logic levels. At this point, both the logic 0 level and logic 1 level have the same gain. The higher level 118 of $V_{agc}$ voltage line 114 is where only the logic 1 carries through the 500 Hz modulation. That is, at the higher voltage level, the logic 0 level has basically no gain. Thus, as far as the output of the average power control circuit is concerned, the logic 0 level circuit is not present.

In FIG. 3b, a description of the effect of amplitude modulating the voltage appears. With additive modulation the signals at the logic 0 level and at logic 1 level are in phase with one another. With amplitude modulation, the 500 Hz signal that the logic 0 level carries is 180° out of phase with the 500 Hz signal that the logic 1 level carries. Thus, when the logic 0 level and the logic 1 level have the same gain through the laser, the 500 Hz signals cancel each other out. On reaching the threshold region, the gain on the logic 0 level 500 Hz signal drops. A 500 Hz signal with amplitude proportional to the difference between the logic 1 and the logic 0 gains will now appear at the outputs of 22. The 500 Hz signal increases as the laser drives below the threshold level.

At FIG. 3c appears $V_{agc}$ signal line 114, $V_{am}$ signal line 126, and a difference between the these two signals, i.e., ($V_{agc}$-$V_{am}$) line 134. As the laser signal drives into the threshold region, AM voltage 126 starts to increase and provides a value to subtract from the $V_{agc}$ in establishing the voltage ($V_{agc}$-$V_{am}$). As FIG. 3d depicts, the difference that results is flat signal line 134. Thus, as FIG. 3d depicts, the process of FIGS. 3a through 3c, produces only one stable operating point. That is, there is only one intersection point 136 between $V_{peak}$ line 112, i.e., the difference ($V_{agc}$-$V_{am}$) line 128.

THE CONTROL PROCESS

Figure 4:
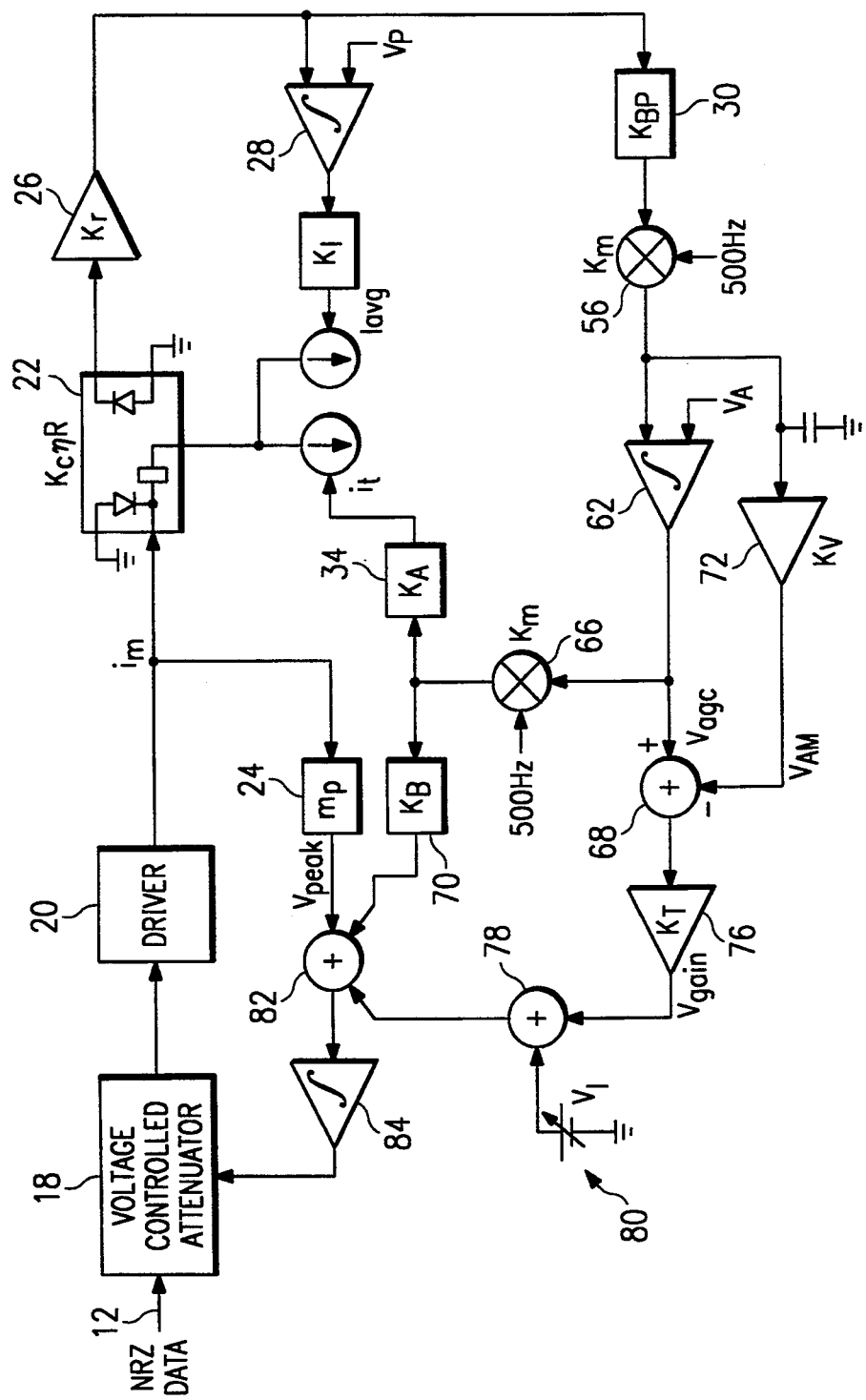
FIG. 4 shows a feedback control diagram that describes the various control rules that the present invention uses.

Having described the control process of the present embodiment, there is yet the benefit of considering a system that implements the concepts of the present invention in a manner other than of the circuit specifically that described in connection with FIGS. 1. For this reason as well as to more completely detail the operation of the present embodiment, the following discussion describes the control rules for controlling the modulation of laser hybrid circuit 22. A first consideration is the operation of the average power control loop. Note that reference numerals of FIG. 4 are the same as those for the circuit components of modulation controller circuit 10 of FIG. 1. These reference numerals, however, primarily relate to the functions that the various components perform rather than their respective structures. Referring to FIG. 4, the gain of the transimpedance amplifier, $K_r$, (e.g., average power adjust amplifier 26) is adjusted to set the average power to a constant value, typically 1 mW. The average optical power at the laser front facet is given by:

$$L_{avg} = m(1_{avg} - 1_{th}) \qquad (1)$$

where
  m = laser slope above threshold;
  $1_{th}$ = laser threshold current; and
  $1_{avg}$ = laser average current.
Laser hybrid circuit 22 back facet detector 88 current is given by:

$$I_{RBD} = K_c \eta R L_{avg} \qquad (2)$$

where
  $K_c$ = laser 86 to back facet detector 88 coupling
  $\eta$ = detector 88 efficiency; and
  R = detector 88 responsivity.
The average power control loop maintains the output of the transimpedance amplifier equal to $V_p$. Therefore, combining Equations (1) and (2) to obtain a value for $V_p$, yields the following expression:

$$V_p = K_r I_{RBD} = K_r K_c \eta R M (1_{avg} - 1_{th}) \qquad (3)$$

or $$l_{avg} = \frac{V_p}{mK_1} + l_{th} \qquad (4)$$

where $K_1 = K_r K_c \eta R$, or, equivalently, so then $$L_{avg} = \frac{V_p}{K_1} . \qquad (5)$$

Equation (5) represents the fact that the optical average output power is held constant regardless of variation in laser gain or laser threshold current.

When NRZ data modulation is AC coupled into the laser, the optical logic 1, $L_1$, and the optical logic 0, $L_0$, levels are given by:

$$L_1 = L_{avg} + m\frac{i_m}{2} ; \text{ and} \qquad (6)$$

$$L_0 = L_{avg} - m\frac{i_m}{2} , \qquad (7)$$

where $i_m$ = peak-to-peak modulation current.

An important consideration of the present invention is to maintain a constant extinction ratio, $\epsilon$, over the operational life of the transmitter. The extinction ratio may be defined as follows:

$$\epsilon = \frac{L_1}{L_0} = \frac{L_{avg} + m\frac{i_m}{2}}{L_{avg} - m\frac{i_m}{2}} . \qquad (8)$$

Solving Equation (8) for $i_m$ yields the following expression:

$$i_m = \frac{2}{m} \frac{\epsilon - 1}{\epsilon + 1} L_{avg}. \qquad (9)$$

$L_{avg}$ is not directly measurable, however, in the present embodiment. The optical power, $L_{out}$, coupled into the optical fiber pigtail, on the other hand, can be measured.

$$L_{out} = \eta_c L_{avg}, \qquad (10)$$

where $\eta_c$ = coupling efficiency. From Equations (9) and (10), the following expression results:

$$i_m = \frac{2}{m} \frac{\epsilon - 1}{\epsilon + 1} \frac{L_{out}}{\eta_c} . \qquad (11)$$

In order to maintain a constant extinction ratio as the laser gain varies, the present embodiment changes the NRZ data modulation current as the inverse of the laser gain. The present invention uses an AGC loop to generate a voltage with a 1/m proportionality, as FIG. 4 shows.

An expression relating $V_{agc}$ to laser gain is derived as follows:

$$V_A = K_1 K_{BP} K_m m \, i_t \qquad (12)$$

where
  $i_t$ = control tone current;
  $K_m$ = synchronous detector gain; and
  $K_{Bp}$ = band pass filter gain.

Now, $i_t$ may be derived from $V_{agc}$ by applying the following factors:

$$i_t = K_m K_A V_{agc} \tag{13}$$

Solving Equation (13) for $V_{agc}$ in view of Equation (12) yields the following expression:

$$V_{agc} = \frac{V_A}{K_1 K_2} \frac{1}{m} \tag{14}$$

where $K_2 = K_m K_A K_{BP} K_m$. $V_{agc}$, therefore, has the required $1/m$ dependence.

To be able to correct $i_m$ for changes in laser hybrid circuit 22 gain, a voltage proportional to $i_m$ is required. The present embodiment uses peak detector 24 to monitor the voltage developed by $i_m$ across the laser and its 20 Ω build out resistor. The peak detector 24 output voltage may be expressed as follows:

$$V_{peak} = m_p i_m = m_p \frac{V_p}{R_L} \tag{15}$$

where $m_p$ = peak detector gain;
$V_p$ = voltage developed across the laser and the build out resistor; and
$R_L$ = build out resistance + laser impedance = 25 Ω.

The approach that the present embodiment uses to control $i_m$ is to use a feedback loop to maintain $V_{peak}$ equal to a level control voltage. A next step of the control process is to make $i_m$ track the laser gain variation by the correct ratio.

Differentiating Equation (11) with respect to laser gain yields the following expression:

$$\frac{di_m}{dm} = -2\frac{\epsilon-1}{\epsilon+1} \frac{L_{out}}{\eta_c} \frac{1}{m^2} \tag{16}$$

Differentiating the two available control parameters yields from Equation (14) the following expression:

$$\frac{dV_{agc}}{dm} = -\frac{V_A}{K_1 K_2} \frac{1}{m^2} \tag{17}$$

From Equation (15), the following expression results:

$$\frac{dV_{peak}}{di_m} = m_p \tag{18}$$

Applying the chain rule to Equations (18) and (16) yields the following expression:

$$\frac{dV_{peak}}{di_m} \frac{di_m}{dm} = \frac{dV_{peak}}{dm} = m_p \left( -2\frac{\epsilon-1}{\epsilon+1} \frac{L_{out}}{\eta_c} \frac{1}{m^2} \right) \tag{19}$$

Equation (19), therefore, provides the desired control rule that the present embodiment encompasses for electrical modulation of the laser hybrid circuit 22 input.

Explaining the relationship between $V_{peak}$ and $V_{agc}$ is also one aspect of the present embodiment. Thus, from the definition for $L_{avg}$ in Equation (5), the following relationship exists:

$$K_1 = \frac{V_p}{L_{avg}} = \frac{V_p}{\frac{L_{out}}{\eta_c}} \tag{20}$$

Substituting from Equation (20) into Equation (19) yields the following expression:

$$\frac{dV_{peak}}{dm} = m_p \left( -2\frac{\epsilon-1}{\epsilon+1} \frac{V_p}{K_1} \frac{1}{m^2} \right). \tag{21}$$

Now, from Equation (17), there is the following expression:

$$-\frac{1}{K_1 m^2} = \frac{dV_{agc}}{dm} \frac{K_2}{V_A} \tag{22}$$

Substituting from Equation (22) into Equation (19) yields the following expression:

$$\frac{dV_{peak}}{dm} = m_p \left( 2\frac{\epsilon-1}{\epsilon+1} V_p \frac{dV_{agc}}{dm} \frac{K_2}{V_A} \right). \tag{23}$$

or, equivalently, $$dV_{peak} = m_p \left( 2\frac{\epsilon-1}{\epsilon+1} V_p \frac{K_2}{V_A} \right) dV_{agc}. \tag{24}$$

Integrating Equation (24) yields the following desired relationship between $V_{peak}$ and $V_{agc}$.

$$V_{peak} = m_p \left( 2\frac{\epsilon-1}{\epsilon+1} V_p \frac{K_2}{V_A} \right) V_{agc} + V_I \tag{25}$$

$$V_{peak} = K_T V_{agc} + V_I \tag{26}$$

where $V_I$ is the offset voltage required to set the initial NRZ data level. Notice that the scaling term $K_T$ contains only constant elements, therefore, only an adjustment for $V_I$ is required according to Equation (26).

One difficulty this control method entails is that the laser gain that the control tone measures actually has two components. One corresponds to the laser gain associated with the optical logic 1, i.e., $m_1$. The other component corresponds to the laser gain associated with the optical logic 0, i.e., $m_0$. The consequence of this dependence is that the measured laser gain is a function of the laser slope and the position of the modulation current logic 0 with respect to the laser threshold. This can lead to a situation where $V_{peak}$ and $V_{agc}$ have two intersection points, the desired one above threshold and an undesired one below threshold. This is the situation that FIGS. 3a through 3d describe in detail above.

The following discussion describes in more detail how the present embodiment eliminates the two stable operating points problem using a second control tone for amplitude modulation (AM) of the NRZ data. The AM tone is recovered at the output of the back facet detector and a DC voltage proportional to the recovered AM tone level is then subtracted from $V_{agc}$ to yield a control voltage with almost no threshold sensitivity.

The recovered AM tone level, $V_{AM}$, may be expressed as follows:

$$V_{AM} = m_A K_{AM} V_{agc} \quad (27)$$

where $$K_{AM} = \frac{1}{m_p} K_m K_B K_1 K_{BP} K_m K_v \quad (28)$$

and $m_A$ = laser gain for AM tone. Subtracting $V_{AM}$ from $V_{agc}$ and using Equation (27) yields the following expression:

$$V_{agc} - V_{AM} = V_{agc}(1 - K_{AM} m_A). \quad (29)$$

Note, however, that from Equation (14), the following expression holds:

$$V_{agc} = \frac{V_A}{K_1 K_2} \frac{1}{m} = \frac{K_{agc}}{m} \quad (30)$$

Now the effects of the laser threshold have to be incorporated into $V_{AM}$ and $V_{agc}$ to yield the following expressions:

$$V_{AM} = (m_1 - m_0) K_{AM} V_{agc} \quad (31)$$

and $$V_{agc} = \frac{K_{agc}}{m_1 + m_0} \quad (32)$$

Then, from Equation (29) there is the following relationship:

$$V_{agc} - V_{AM} = \frac{K_{agc}}{m_1 + m_0}(1 - K_{AM}(m_1 - m_0)) \quad (33)$$

Let $m_0 = \alpha m_1$ where $0 \leq \alpha \leq 1$. Then, $$V_{agc} - V_{AM} = \frac{K_{agc}}{m_1(1 + \alpha)}(1 - K_{AM}(m_1(1 - \alpha))) \quad (34)$$

For above-threshold operation, $\alpha = 1$ and the AM term has no effect. With $\alpha = 1$, from Equation (34)

$$V_{agc} - V_{AM} = \frac{K_{agc}}{2m_1} = V_{agc0} \quad (35)$$

Now, when $\alpha = \frac{1}{2}$, $K_{AM}$ may be adjusted so that $$V_{agc} - V_{AM} = \frac{K_{agc}}{\frac{3}{2}m_1}\left(1 - \frac{1}{2} K_{AM} m_1\right) = V_{agc0} \quad (36)$$

Solving for $K_{AM}$, $$K_{AM} = \frac{1}{2m_1} \quad (37)$$

Substituting for $K_{AM}$ in (9) yields.
Which is dependent of $\alpha$, i.e. perfect compensation.

$$V_{agc} - V_{AM} = \frac{K_{agc}}{m_1(1 + \alpha)}\left(1 - \frac{1}{2m_1}(m_1(1 - \alpha))\right) \quad (38)$$

$$= \frac{K_{agc}}{m_1(1 + \alpha)}\left(1 - \frac{1}{2}(1 - \alpha)\right)$$

$$= \frac{K_{agc}}{2m} = V_{agc0}$$

An AM compensation adjustment will be required to set $K_{AM}$ as the laser gain varies from unit to unit. As well as compensation will not be perfect as the laser gain changes from its initial value due to temperature or aging effects. This imperfection will have no effect on operation above the laser threshold level, but it does prevent this control technique from being used in the threshold region.

In summary, there is provided by the present embodiment a laser controller using both additive and amplitude modulation that the method of providing laser modulation control comprises the steps of modulating DC bias of a laser with a first control tone, amplitude modulating an input NRZ (non-return to zero) working signal to be converted to light output with a second control tone, detecting the first control tone from a portion of the light output of the laser as a third signal which is proportional to laser gain, detecting the second control tone from a portion of the light output of the laser as a fourth signal which occurs only if the laser is being modulated in or below the lasing threshold region, and substantively combining the third and fourth signals to generate a fifth signal for use as a control of the amplitude of said NRZ working signal.

ALTERNATIVE EMBODIMENTS

There are any number of alternatives or changes in the design of laser modulation controller 10 which may be readily apparent to one of ordinary skill in the art. Such alternatives may not be employed in the device of the preferred embodiment for any number of reasons, such as costs and performance considerations, packaging or size constraints, availability of materials, arbitrary design decisions, and the like. A number of these alternatives have been mentioned above. This is, of course, done without limitation of other embodiments which may be equally obvious to one of ordinary skill in the art, but are not mentioned here because of time and space constraints. Therefore, it is the following claims, and not the above or other embodiments that limit the scope and spirit of the present invention.

What is claimed is:

1. A method for modulating the laser output signals of a laser circuit, comprising the steps of:
   controlling the peak voltage input into the laser circuit;
   additive modulating NRZ (non-return to zero) data signals to produce an additive modulated control voltage into the laser circuit when laser output signals exceed a threshold value that exists when the level of NRZ data signals of the additive modulated control equals the peak voltage input at a stable operating point;
   amplitude modulating the NRZ data signals to produce an amplitude modulated control voltage;

subtractively combining the additive modulated control voltage and the amplitude modulated control voltage when laser output signals exceed the threshold value to produce a combined voltage value; and directing the combined voltage value to the laser circuit when the laser output signals exceed the threshold value to operate the laser circuit in a stable and constant input voltage level for all NRZ data signal levels.

2. The method of claim 1, further comprising the step of controlling the peak voltage input into the laser circuit using a voltage control attenuator circuit.

3. The method of claim 1, further comprising the step of controlling the current bias of the laser circuit using an average power control circuit that senses and controls the average power output from the laser circuit.

4. The method of claim 1, further comprising the step of measuring the laser output signal level using a synchronous detector filter circuit.

5. The method of claim 1, further comprising the step of supplying to the laser circuit a current having
 (1) a direct current component for controlling average laser current bias;
 (2) the combined voltage when the level of NRZ data signals exceeds the threshold level; and
 (3) the additive modulated voltage when the level of NRZ data signals is less than or equal to the threshold level.

6. Apparatus for providing laser modulation control comprising in combination:

laser apparatus including electrical input, bias input, power light output and power level monitor output;

NRZ (non-return to zero) working signal supply means;

signal amplitude control connected between said electrical input of said laser apparatus and said NRZ signal supplying means and including a control input;

tone apparatus for generating first and second control tones;

bias means connected to said first and second control tones;

bias means connected to said DC bias input of said laser apparatus and to said tone apparatus for additively modulating said laser apparatus with said first control tone;

first detection circuit connected to said power level monitor output of said laser apparatus for detecting said first control tone from a portion of the light output of the laser as a third signal which is proportional to laser gain;

second detection circuit connected to said power level monitor output of said laser apparatus for detecting said second control tone from a portion of the light output of the laser as a fourth signal, the second control tone only being detectable when the logic zero portion of the NRZ working signal extends the modulation into the non-linear conversion region; and subtraction circuit connected between said first and second detection circuits and said control input of said signal amplitude control for combining said third and fourth signals, to generate a fifth signal for use as a control of the amplitude of said NRZ working signal.

7. The method of providing laser modulation control comprising the steps of:

modulating DC bias of a laser with a first control tone;

amplitude modulating an input NRZ (non-return to zero) working signal to be converted to light output with a second control tone;

detecting said first control tone from a portion of the light output of the laser as a third signal which is proportional to laser gain;

detecting said second control tone from a portion of the light output of the laser as a fourth signal which fourth signal occurs only when the logic zero portion of the NRZ working signal extends the modulation into the non-linear conversion region; and subtractively combining said third and fourth signals to generate a fifth signal for use as a control of the amplitude of said NRZ working signal.

8. The method of claim 7 comprising the additional step of time multiplexing the first and second control tones to simplify the detection circuitry and minimize disruption of the working signal.

9. Apparatus for providing laser modulation control comprising in combination:

laser apparatus including electrical input, DC bias input, light output and monitor output;

working signal supplying means;

signal amplitude control connected between said electrical input of said laser apparatus and said working signal supplying means and including a control input;

tone means for generating first and second control tones;

bias means connected to said DC bias input of said laser apparatus and to said tone means for modulating the light level output of said laser apparatus with said first control tone;

amplitude modulation apparatus connected to said control input of said signal and amplitude control and to said tone means for modulating the input working signal with said second control tone;

first detection means, connected to said monitor output of said laser apparatus, for detecting said first control tone from a portion of the light output of the laser as a third signal;

second detection means, connected to said power level monitor output of said laser apparatus, for detecting said second control tone from a portion of the light output of the laser as a fourth signal; and substantive circuitry connected between said first and second detection circuits and said control input of said signal amplitude control for combining said third and fourth signals to generate a fifth signal for use as a control of the amplitude of said working signal.

10. A laser apparatus comprising in combination:

laser circuitry including electrical input, DC bias input, light output and monitor output;

a working signal supply;

signal amplitude control connected between said electrical input of said laser circuitry and said working signal supply and including a control input;

bias means, connected to said DC bias input of said laser apparatus, for modulating the light level output of said laser apparatus a first control tone;

amplitude modulation means, connected to said control input of said signal amplitude control, for modulating the working signal with a second control tone;

detection means, connected to said monitor output of said laser apparatus, for detecting said first and second control tones from a portion of the light output of the laser as third and fourth signals respectively; and substantive circuitry connected between said detection means and said control input of said signal amplitude control for subtractively combining said third and fourth signals to generate a difference fifth signal for amplitude control of said working signal.

11. Apparatus as claimed in claim 10 comprising, in addition:

peak detection means, connected between said electrical input of said laser apparatus and said control input of said signal amplitude control, for providing a sixth signal, indicative in amplitude of the peak to peak amplitude of the working signal, to be used in maintaining the peak to peak amplitude within but near the limits of linear signal conversion of said laser apparatus, said peak detection means additionally operating to filter out the working signal from said sixth signal.

* * * * *